United States Patent
Singh et al.

(10) Patent No.: US 7,235,489 B2
(45) Date of Patent: Jun. 26, 2007

(54) DEVICE AND METHOD TO ELIMINATE SHORTING INDUCED BY VIA TO METAL MISALIGNMENT

(75) Inventors: Ranbir Singh, Singapore (SG); Sen Sidhartha, Singapore (SG); Nace Rossi, Singapore (SG)

(73) Assignee: Agere Systems Inc., Allentown, PA (US)

( * ) Notice: Subject to any disclaimer, the term of this patent is extended or adjusted under 35 U.S.C. 154(b) by 136 days.

(21) Appl. No.: 10/850,812

(22) Filed: May 21, 2004

(65) Prior Publication Data

US 2005/0260843 A1    Nov. 24, 2005

(51) Int. Cl.
*H01L 21/44* (2006.01)
*H01L 21/4763* (2006.01)

(52) U.S. Cl. ............... 438/696; 438/639; 438/963; 257/E21.584

(58) Field of Classification Search .......... 438/906, 438/963, 637–641, 694–696; 134/1.2–1.3; *H01L 21/44, H01L 21/4763*
See application file for complete search history.

(56) References Cited

U.S. PATENT DOCUMENTS

| | | | | |
|---|---|---|---|---|
| 5,498,312 A * | 3/1996 | Laermer et al. | ............ | 438/695 |
| 5,501,893 A * | 3/1996 | Laermer et al. | ............ | 428/161 |
| 5,750,403 A * | 5/1998 | Inoue et al. | ................ | 438/787 |
| 5,866,945 A * | 2/1999 | Chen et al. | ................ | 257/750 |
| 6,051,869 A * | 4/2000 | Pan et al. | .................. | 257/506 |
| 6,080,661 A * | 6/2000 | Bothra | ...................... | 438/637 |
| 6,136,694 A * | 10/2000 | Ho | .............................. | 438/637 |
| 6,143,647 A * | 11/2000 | Pan et al. | .................. | 438/637 |
| 6,180,518 B1 * | 1/2001 | Layadi et al. | ............... | 438/639 |
| 6,399,512 B1 * | 6/2002 | Blosse et al. | ............... | 438/723 |
| 6,423,630 B1 * | 7/2002 | Catabay et al. | ............ | 438/624 |
| 6,433,433 B1 * | 8/2002 | Sengupta | .................... | 257/763 |
| 6,518,166 B1 * | 2/2003 | Chen et al. | ................. | 438/622 |
| 6,531,389 B1 * | 3/2003 | Shue et al. | .................. | 438/637 |
| 6,554,004 B1 * | 4/2003 | Nguyen et al. | ............. | 134/1.3 |
| 6,605,540 B2 * | 8/2003 | Ali et al. | ..................... | 438/694 |
| 6,815,334 B2 * | 11/2004 | Yoon | ......................... | 438/624 |
| 2001/0012694 A1 * | 8/2001 | Coburn et al. | ............. | 438/689 |
| 2002/0187643 A1 * | 12/2002 | Gu et al. | ..................... | 438/694 |
| 2003/0186542 A1 * | 10/2003 | Yen et al. | .................... | 438/672 |
| 2005/0090085 A1 * | 4/2005 | Lindsay | ...................... | 438/586 |
| 2005/0153538 A1 * | 7/2005 | Tsai et al. | ................... | 438/636 |
| 2005/0260845 A1 * | 11/2005 | Ali | ............................. | 438/622 |
| 2006/0108576 A1 * | 5/2006 | Laermer et al. | ............. | 257/40 |

OTHER PUBLICATIONS

SAC™ (semi-aqueous chemistry) Remover; "Aqueous-Organic Formulations That Quickly and Completely Remove all Types of Post-Etch Residue Under Ambient Conditions"; www.ekctech.com.
Baker Aleg—310 Stipper/Residue Remover; J.T. Baker Microelectronic Materials, 2002.

* cited by examiner

*Primary Examiner*—B. William Baumeister
*Assistant Examiner*—Matthew W. Such

(57) ABSTRACT

The present invention provides an interconnect that can be employed in an integrated circuit. The interconnect includes a metal line located over a substrate, a dielectric layer located over the metal line, and an interconnect located in the dielectric layer, including a landed portion located over the metal line and an unlanded portion located along at least a portion of a lateral edge of the metal line. The unlanded portion is at least partially filled with a polymer, and the landed portion is substantially filled with a conductive material. A method for manufacturing the interconnect is also provided.

11 Claims, 6 Drawing Sheets

DEVICE AND METHOD TO ELIMINATE SHORTING INDUCED BY VIA TO METAL MISALIGNMENT

TECHNICAL FIELD OF THE INVENTION

The present invention is directed, in general, to semiconductor devices, and more specifically, to a device and method that substantially reduces or eliminates shorting induced by via to metal misalignment.

BACKGROUND OF THE INVENTION

As semiconductor device dimensions have continued to shrink, it has become increasingly difficult to construct high yields of defect-free devices because of a number of challenges that have arisen in manufacturing these smaller devices. One such challenge is the production of interconnects. Due to the substantial decrease in device size, it has become progressively more difficult to maintain proper alignment of interconnect openings with targeted metal lines. Often, the pattern through which the interconnect opening is formed slightly misaligns with the underlying metal line. When conventional over-etch processes are conducted to insure that the dielectric layer is completely etched through to the metal line, the misaligned portion of the pattern will cause the etch to remove dielectric material along a lateral edge of the metal line. Thus, while a substantial portion of the opening lands on the intended metal line a small portion of the opening extends along a side edge of the metal line.

The misalignment of these interconnect openings is exacerbated by the fact that, as device sizes have continued to shrink, device aspect ratios and device densities have continued to increase. This causes an additional problem when forming the dielectric layer over such device topographies. Frequently, when dielectric materials are deposited, the high aspect ratios of the devices and their close proximity to each other prevents the dielectric material from uniformly depositing between the devices. As a result, voids can form adjacent the metal lines, and when the over-etch process is conducted, the etch can extend the opening to intersect with the void and extend across to another adjacent metal line, thereby creating a short when the opening is filled with metal.

Previous efforts to reduce short circuits due to via misalignment are not entirely satisfactory. Some efforts involve applying deposition processes, or using insulating materials with better void filling properties. Although some insulators are better void fillers than others, most insulating materials develop voids as design rules shrink. Moreover, the edge of the wafer is more susceptible to incomplete void filling than the center regardless of the deposition process used. In addition, an insulating material with little or no voids can have a higher capacitance than a void-containing insulating material. The use of an insulating material with a higher capacitance, in turn, will result in slower operating speeds for the semiconductor device.

Other ameliorative efforts have focused on decreasing the extent of misalignment between the via and the metal line. A certain degree of misalignment is inevitable, however, as design rule dimensions decrease to the resolution limits of photolithography. Misalignments can be corrected to some extent by reworking the semiconductor wafer. But reworking decreases the throughput of semiconductor device production, thereby increasing production costs. Furthermore, reworking can detrimentally alter the properties of the semiconductor wafer. For example, the chemical and plasma cleaning processes that are conducted to strip away photoresist can roughen the surface or alter the optical properties of the wafer, thereby detrimentally affecting the success of subsequent photolithographic processes.

Accordingly, what is needed in the art is a process for manufacturing interconnects in a semiconductor device that does not exhibit the limitations of the prior art.

SUMMARY OF THE INVENTION

To address the above-discussed deficiencies of the prior art, the present invention provides, in one embodiment, a process for forming a semiconductor device interconnect. The process includes, forming a dielectric layer over a metal line located on a substrate, forming an opening in the dielectric layer to the metal line, wherein a landed portion of the opening is located over the metal line and an un-landed portion is located along a lateral edge of the metal line, and at least partially filling the un-landed portion with a polymer.

Another embodiment is directed to a semiconductor device interconnect. The interconnect comprises a metal line located over a substrate, a dielectric layer located over the metal line, and an interconnect located in the dielectric layer, including a landed portion located over the metal line and an un-landed portion located along at least a portion of a lateral edge of the metal line. The un-landed portion is at least partially filled with a polymer, and the landed portion is substantially filled with a conductive material.

Still another embodiment is directed to an integrated circuit. In one embodiment, the integrated circuit includes active devices located over a semiconductor substrate, dielectric layers located over the active devices, metal lines located over the active devices, and interconnects located in dielectric layers, wherein at least one of the interconnects includes a landed portion located over one of the metal lines and an un-landed portion located along at least a portion of a lateral edge of the at least one of the metal lines. The un-landed portion is at least partially filled with a polymer, and the landed portion is substantially filled with a conductive material. The interconnects interconnect the active devices to form an operative integrated circuit.

The foregoing has outlined preferred features of the present invention so that those of ordinary skill in the art may better understand the detailed description of the invention that follows. Additional features of the invention will be described hereinafter that form the subject of the claims of the invention. Those of ordinary skill in the art would appreciate that they can readily use the disclosed conception and specific embodiments as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes that the deficiencies associated with interconnect designs and fabrication processes can be avoided by promoting the production of a polymer in the final stages of forming an interconnect opening, such as a via opening. The polymer fills that portion of the opening that does not land on the metal line, which is referred to herein as the "unlanded" portion. The polymer prevents metal from entering the unlanded portion, and thus, prevents the metal from entering an adjacent void, which might be present in the dielectric layer, and creating a short between metal lines. The process of forming interconnects according to the present invention has the advantage of being readily implemented with existing semiconductor device manufacturing tools and materials. Moreover, as further explained below, the interconnect of the present invention advantageously accommodates the use of insulating layers that have voids therein. This, in turn, facilitates the use of insulating materials having a low dielectric constant, thereby reducing the capacitance and improving the operating speed of the semiconductor device.

The recognition of the use of polymer to fill the unlanded portion of the interconnect opening is very much in contrast to conventional processes where etchant precursors for via etching are typically chosen to provide higher selectivity toward the generation of reactive etchant species, and not the production of polymers. Polymer production is generally avoided out of concern that polymers will form on the sidewalls of the opening, thereby blocking the complete formation of the opening down to the metal line. The avoidance of polymer production is also generally considered desirable because aggressive cleaning protocols used to clean the opening do not have to be used.

In the present invention, problems associated with the overproduction of polymers are avoided by adjusting the opening via etching process such that the production polymer is briefly promoted in the final stages of opening etching. By fine tuning the opening etching process, enough polymer is generated so as to fill portions of the opening that develop into voids located adjacent the metal lines. Moreover, because the amount of polymer produced in the opening is limited, nonaggressive cleaning protocols can be used to substantially remove all of the polymer from the side walls and bottom of the via directly over the metal line, but not in the void.

Figure 1:
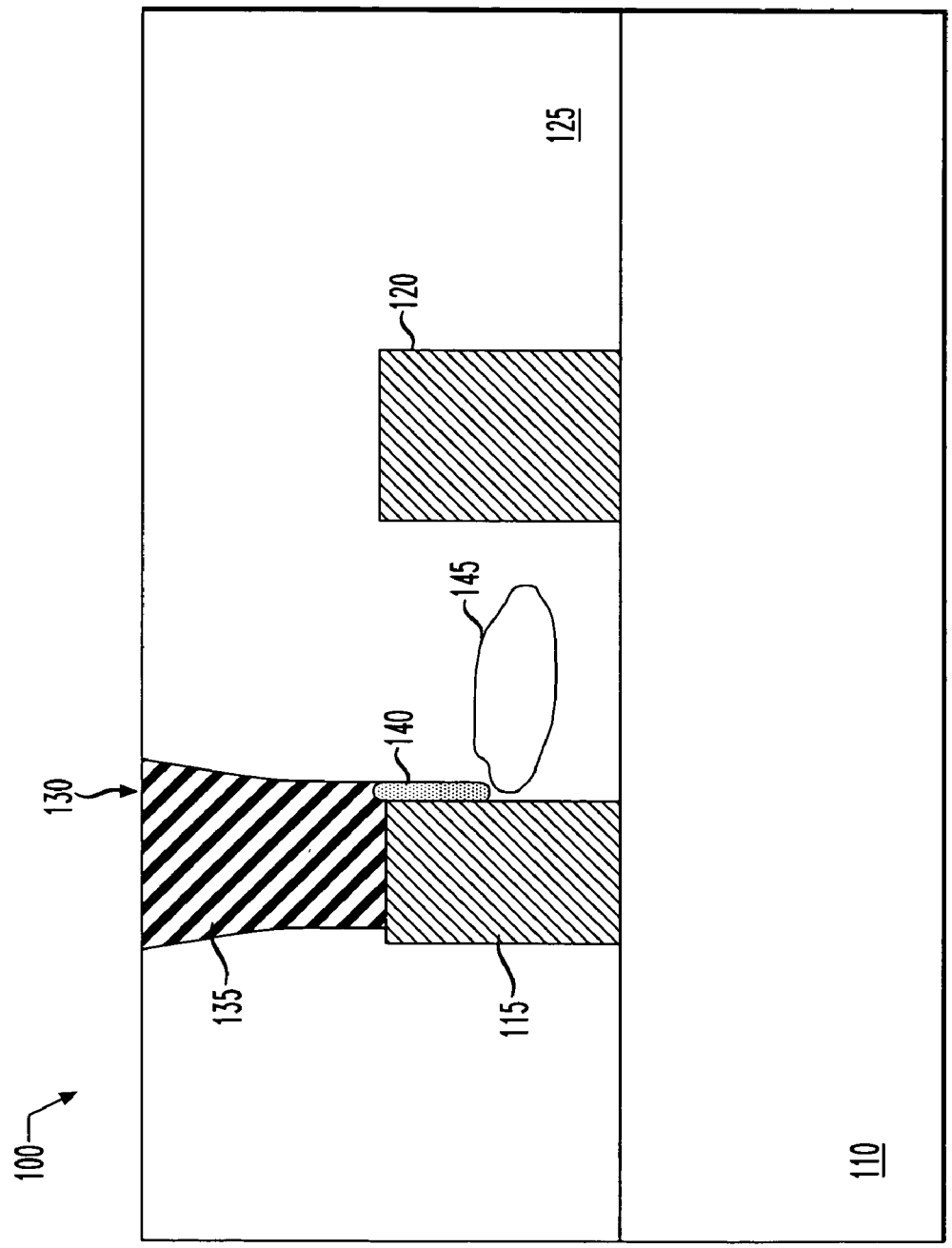
FIG. 1 illustrate a sectional view of an interconnect as provided by one embodiment.

Turning initially to FIG. 1, there is illustrated a sectional view of an embodiment of an interconnect 100 as provided by the present invention. This embodiment includes a lower dielectric layer 110 on which are formed metal lines 115, 120. Another dielectric layer 125 is formed over the lower dielectric layer 110. An interconnect structure 130 contacts the metal line 115 and includes a landed portion 135 that is substantially filled with a conductive material, such as tungsten, and an unlanded portion 140 that is at least partially filled with a polymer. A void 145, as discussed above, is also shown adjacent the polymer filled unlanded portion 140.

One embodiment of the present invention is a process for forming a semiconductor device interconnect. FIGS. 2A-2F illustrate sectional views of a partially completed interconnect 200 at selected stages in an exemplary process following the principles of the present invention.

Figure 2A:
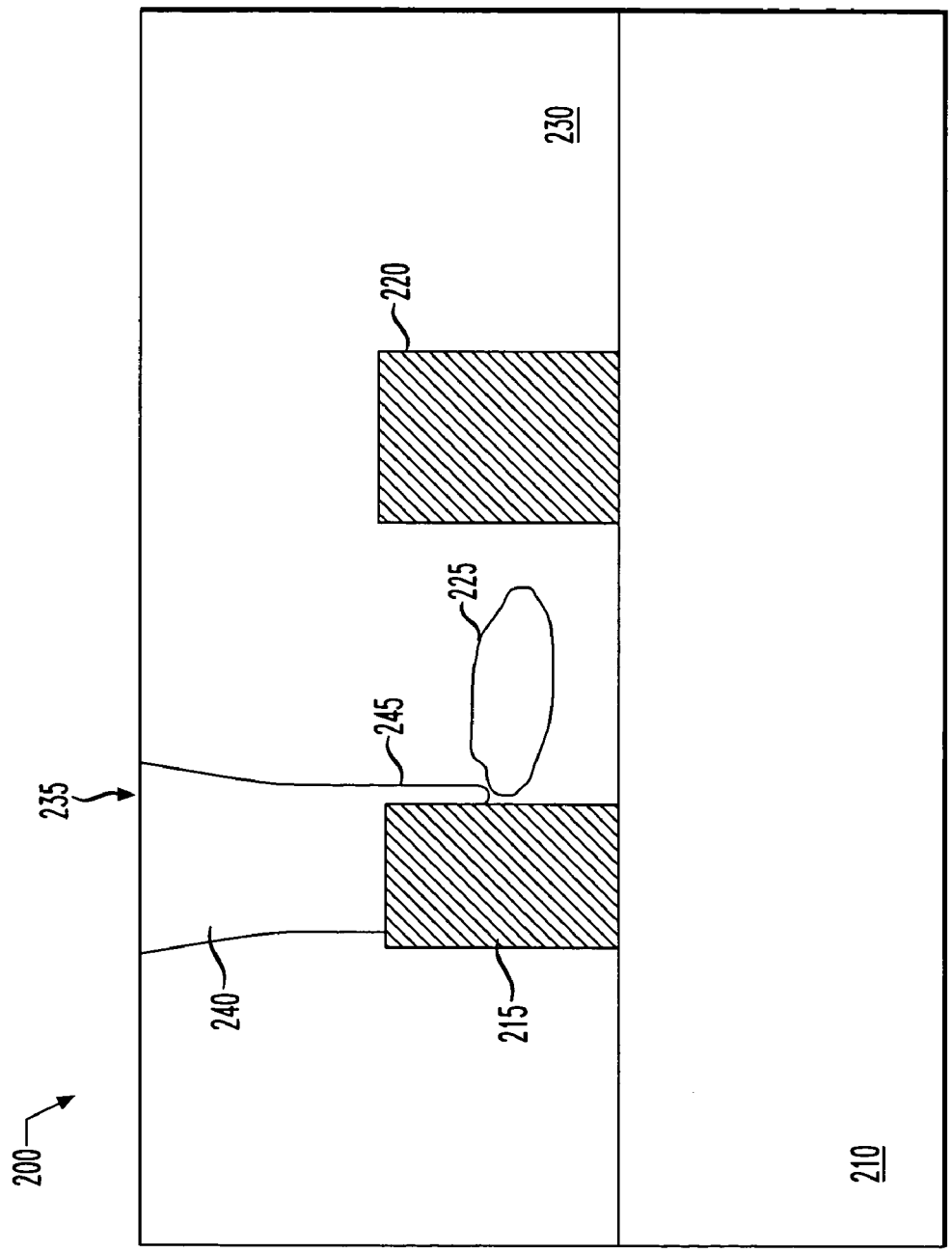
FIGS. 2A-2D illustrate sectional views of the interconnect of FIG. 1 at various stages of fabrication.

Turning to FIG. 2A, illustrated is a partially completed interconnect 200. In this embodiment, the partially completed interconnect includes a conventional dielectric substrate 210 on which metal lines 215, 220 are conventionally formed. The dielectric substrate 210 may be any dielectric material well known to those skilled in the art, such as silicon dioxide, a low dielectric constant material, or a non-silicon dielectric material. It should be understood that fabrication materials and the spacing density and the overall dimensions of the metal lines may vary, depending on design, and the present invention is applicable to various types of device topographies. However, in one embodiment, the device spacing density of the metal lines 215, 220 is high, as is the aspect ratios of the metal lines 215, 220. For example, in some cases, a design rule might call for the two metal lines 215, 220 to be separated a distance of about 0.22 microns and for the metal lines 215, 220 to have a width of about 0.22 microns and a height of about 680 nm. As a result, the dielectric material may not be able to properly fill in between the metal lines 215, 220 and voids 225, only one of which is illustrated for simplicity, may form during the conventional formation of dielectric layer 230.

The voids 225 serve to reduce an effective dielectric constant of the dielectric layer 230 to be less than the dielectric constant of the dielectric layer 230 without voids 225. As mentioned above, the presence of the voids 225 can be desirable because they help to reduce the overall parasitic capacitance of the device. However, in conventional processes it is the very presence of these voids 225 that can cause shorts to form as explained above. Fortunately, the present invention addresses this problem and thereby allows utilization of the voids 225 to lower overall parasitic capacitance, but at the same time, prevent shorts from occurring between the metal lines 215, 220.

Also shown is an opening 235 that has been formed in the dielectric layer 230. The opening 235 may be formed using conventional etch processes. Typically, the primary etch is conducted to over-etch the opening 235 to compensate for center to edge topographical non-uniformities in the dielectric layer 230 across a wafer (not shown). The over-etch is conducted to make certain that all of the dielectric layer 230 is removed over the metal line 215 so that good contact can be made to the metal line 215. As an example, if the dielectric layer 230 has a thickness of 1,000 nm, then over-etching corresponds to extending the etch time for a period equivalent to etching 1,400 nm of the dielectric layer 230. As a result, the opening 235 can include a landed portion 240 located over the metal line 215 and an unlanded portion 245 that extends along a lateral edge of the metal line 215. The concern with the over-etch is that the unlanded portion may intersect the void 225 and cause the void to extend across to the metal line 220, which could result in a short between metal lines 215, 220 when it is filled with a conductive material.

In the present invention, the formation of the opening 235 is tailored by adjusting the etching of the dielectric layer 230 to transition from an etchant that efficiently removes the dielectric layer 230 with a minimum of polymer production, to an etchant with increased polymer production. Preferably, the transition occurs when over-etch is complete.

With continued reference to FIG. 2A, illustrated is the partially completed interconnect 200 after exposing the dielectric layer 230 to a first etchant. Exposure to the first etchant is sufficient to over-etch the opening 235. The first etchant can comprise any conventional etchant precursors, such as fluorocarbons, like $CF_4$ or $C_2F_6$, in the presence of a plasma to form reactive species of the first etchant. As an example, consider when the dielectric layer 230 is silicon dioxide. In one embodiment, the first etchant is a dry etch, such as a plasma, generated from an etchant precursor of $C_4F_8$ introduced at a flow rate of ranging from about 6 sccm to about 10 sccm, using a RF power of ranging from about 1500 watts to about 1800 watts, at pressure of ranging from about 40 mTorr to about 50 mTorr. The first etch may also include other conventional etches, such as a wet-etch process. Moreover, it should be recognized that the etches and parameters used herein may varying depending on the material being etched, and those skilled in the art will understand how to conduct these etches, given the teachings herein. Preferably, however, the first etchant results in substantially no polymer production. Upon completion of the over-etch that forms the landed and unlanded portions of the opening 235, the process parameters are changed to increase the polymer production of the etch. Thus, in essence, the etch is tweaked in a way to become more of a deposition process than an etch process. The tweaking of the etch to a polymer production etch is highly counter intuitive to the processes provided by the prior art. Typically, it is highly undesirable to allow significant amounts of polymer to build up in the opening because it makes cleaning the opening 240 more difficult and may prevent the conductive materials from adequately filling the opening 240.

Figure 2B:
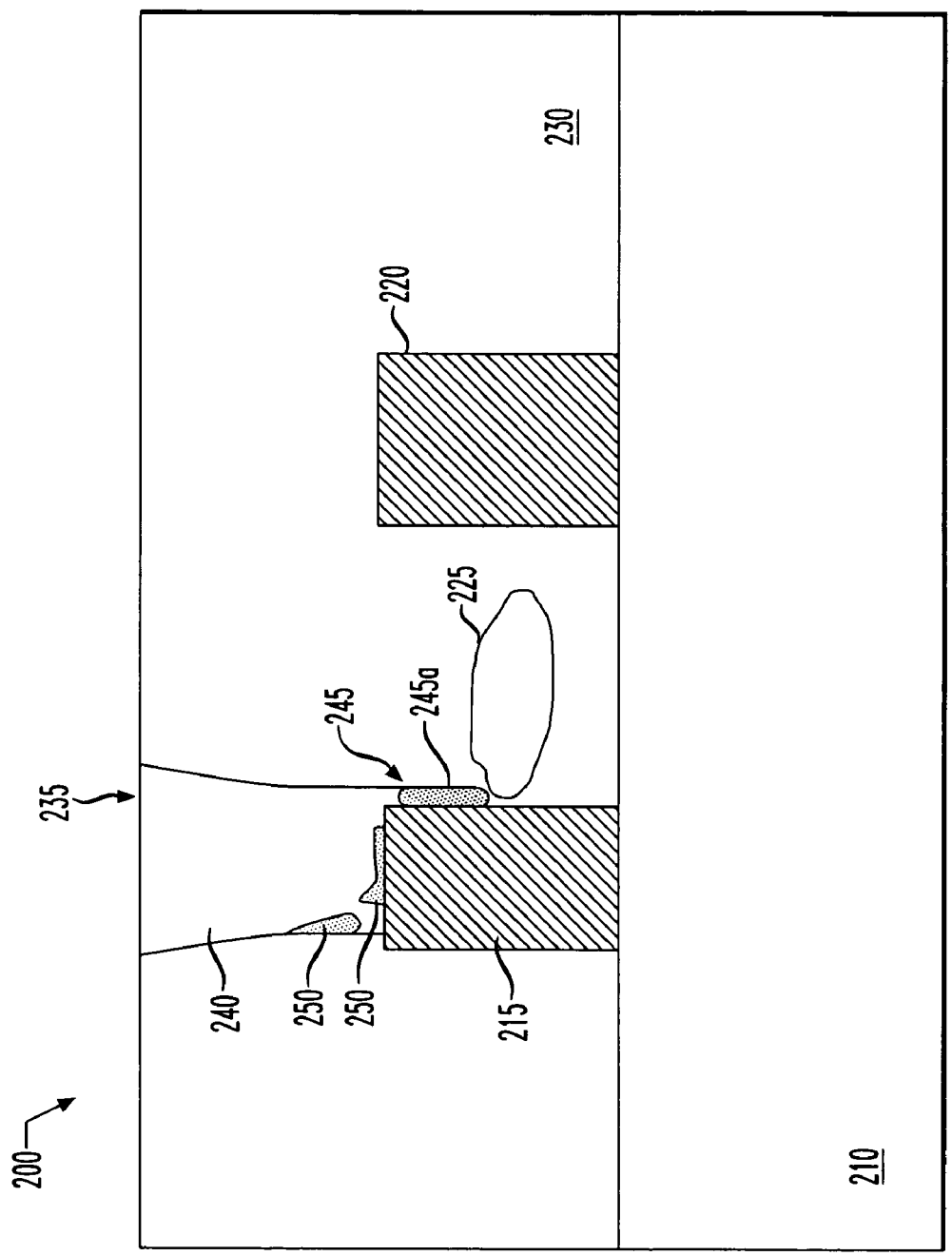

Turning now to FIG. 2B, shown is the partially completed interconnect 200 after exposing the opening 235 to a second etch, or in essence, a polymer deposition process. Thus, the second etchant is chosen to promote the production of a polymer, which in one embodiment is an insulating polymer. The polymer fills the unlanded portion 245 to provide a polymer plug 245a. The polymer may completely fill unlanded portion 245, or it may only partially fill the unlanded portion 245 to the extent necessary to prevent a conductive metal from intersecting the void 225. In some cases, a small amount of polymer 250 is also deposited in the landed portion of the opening 235. However, the amount of polymer 250 is not significant enough to prevent a thorough clean of the opening 240.

In some instances, to promote polymer production, the second etchant is formed from an etchant precursor comprising one or more hydrofluorocarbons (HFC), such as $CHF_3$ or $CH_2F_2$. Continuing with the above example, where the dielectric layer 230 is silicon dioxide, the second etchant can be formed from a precursor of $CH_2F_2$. The $CH_2F_2$ is introduced at a flow rate of ranging from about 10 sccm to about 15 sccm, using a RF power of ranging from about 1000 watts to about 1500 watts, at pressure ranging from about 50 mTorr to about 70 mTorr. Again, it should be recognized that the gases and plasma parameters may vary depending on the materials being used to fabricate the device, and one who is skilled in the art would know how to change the etching process to produce more polymer, given the teachings herein. Moreover, although the above embodiments illustrate the use of a two-step etching process, it should be understood that additional etchants and etching steps can be included to further tailor the process of forming the opening 235.

Figure 2C:
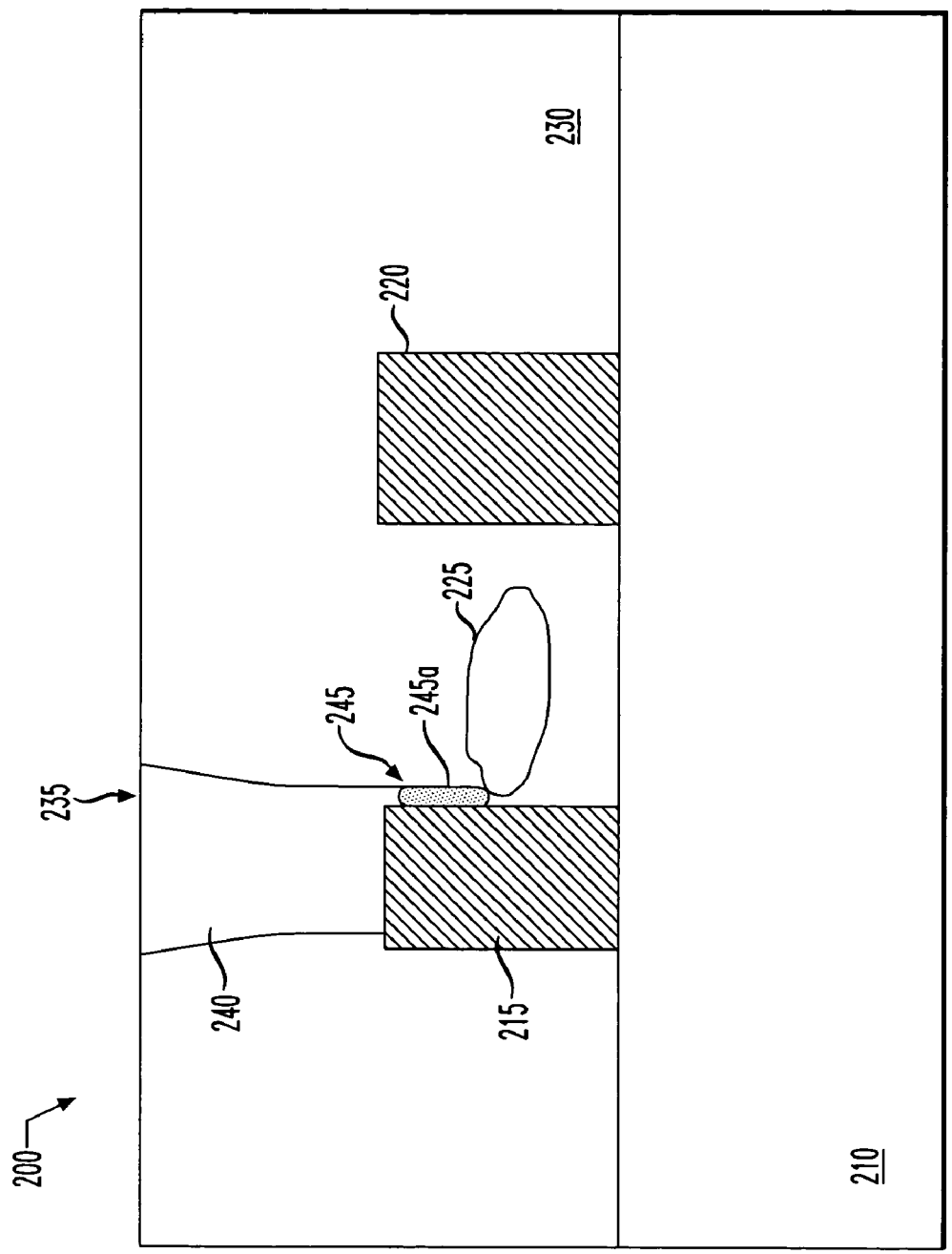

Referring now to FIG. 2C, in some embodiments, forming the opening 230 further includes exposing it to a conventional cleaning agent subsequent to the polymer formation. Exposure to the cleaning agent is adjusted to substantially remove the small amounts of polymer 250, shown in FIG. 2B, from the landed portion 240, but retain the polymer 245a in the unlanded portion 245. In preferred embodiments, the cleaning agent used is a wet chemical cleaning process, or a combination of wet cleaning and dry plasma etching, followed by a deionized water rinse step. In some cases, the cleaning agent comprises a mixture of active components such as organic amines, including hydroxyl amine, ethanol amine, and 2-ethoxy 2-ethanol amine; pyrrolidinone such as N-methyl pyrrolidinone (NMP); sulfons and catechols, and inert carrier solvent, such as diethylene glycol or monobutyl ether. It should be understood, however, that these clean chemistries are well known to those who are skilled in the art.

Given the teachings herein, one of ordinary skill in the art would understand how to vary the concentration and application of these conventional cleaning agents as necessary to substantially remove the polymer 250 from the landed portion 240 of the opening 235, while retaining the polymer plug 245a in the unlanded portion 245 of the opening 235. By way of example only, consider again the above-described example where the dielectric layer 230 is composed of silicon dioxide, and the second etchant includes $CHF_3$. The cleaning agent and process includes using a wet solvent clean referred to in the industry as ALEG310-, which is an alkaline (pH of ~11) amine based organic solvent blend. This is used for a single cycle of 2-3 min. for each batch clean, at 85 degree C., followed by demonized water rinse with CO2 bubbler and then N2 dry. This is in contrast to conventional approaches that use multicycles for a total time of 10-12 nm.

Figure 2D:
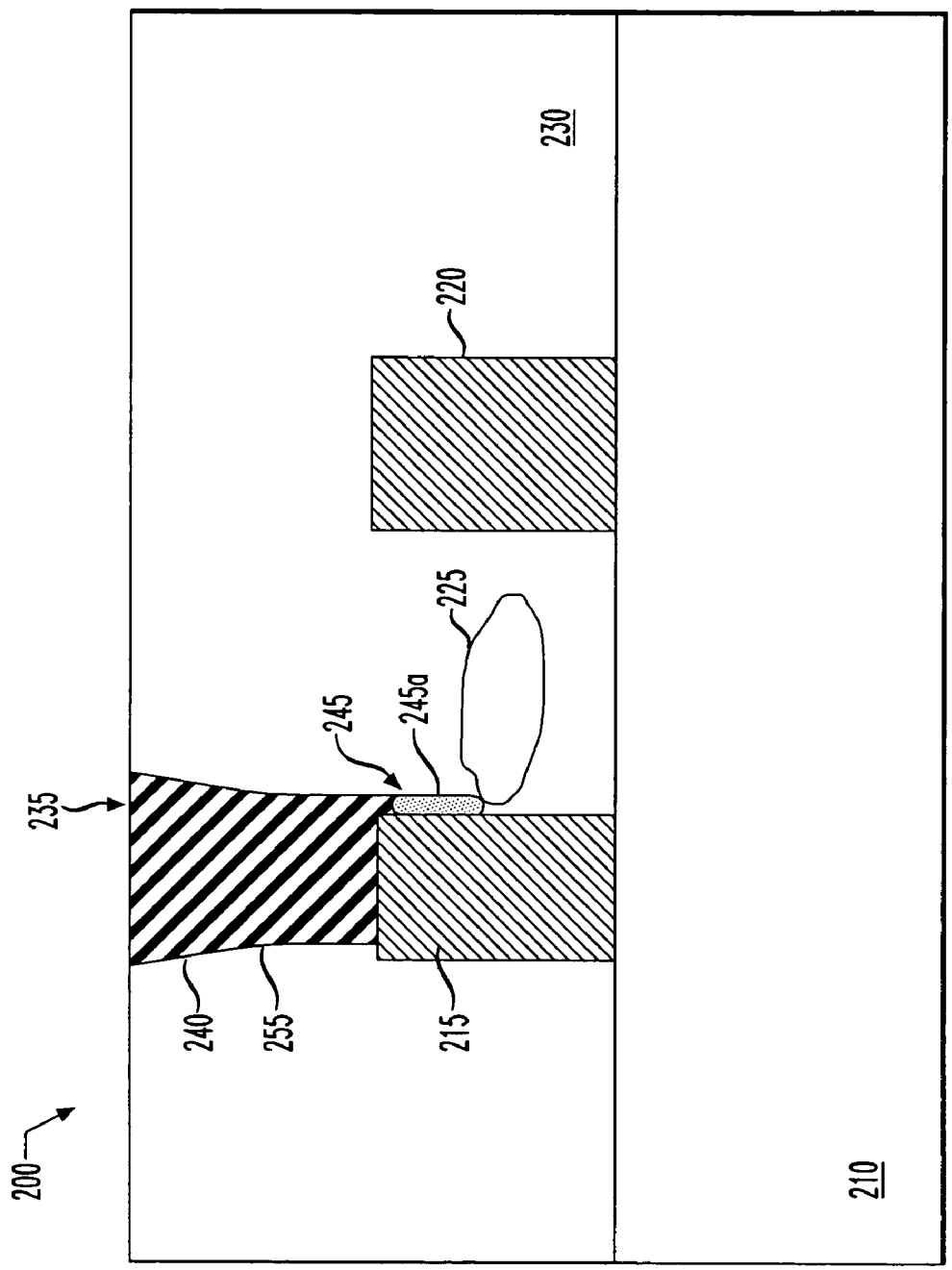

Turning now to FIG. 2D, illustrated is a sectional view of the completed interconnect 200. As illustrated, the land portion 240 of the opening 235 has been conventionally filled with a conductive material 255, such as tungsten. While not shown, it should be understood that prior to deposition of the conductive material 255, a barrier layer appropriate for the conductive material that is being used is deposited in the opening 235. In the example of tungsten, the barrier layer would be a titanium/titanium nitride layer, and in an example where the conductive material is copper, the barrier layer would be tantalum/tantalum nitride. The conductive material 255 is excluded from the unlanded portion 245 that is filled with the polymer plug 245a. During deposition of the conductive material 255, the polymer plug 245a prevents the conductive material 255 from entering the unlanded portion 245 and intersecting the void 225 and shorting the metal lines 215, 220. Thus, the present inventions employs etching processes with the counter intuitive recognition that they can be used to form a polymer in an unlanded portion of an interconnect to prevent shorts from occurring between adjacent metal lines. As such, voids that are present in the dielectric layer need not be eliminated but can be present to reduce parasitic capacitance, but at the same time, not be a possible source for shorts. Since potential shorts are eliminated, device yields increase.

Figure 3:
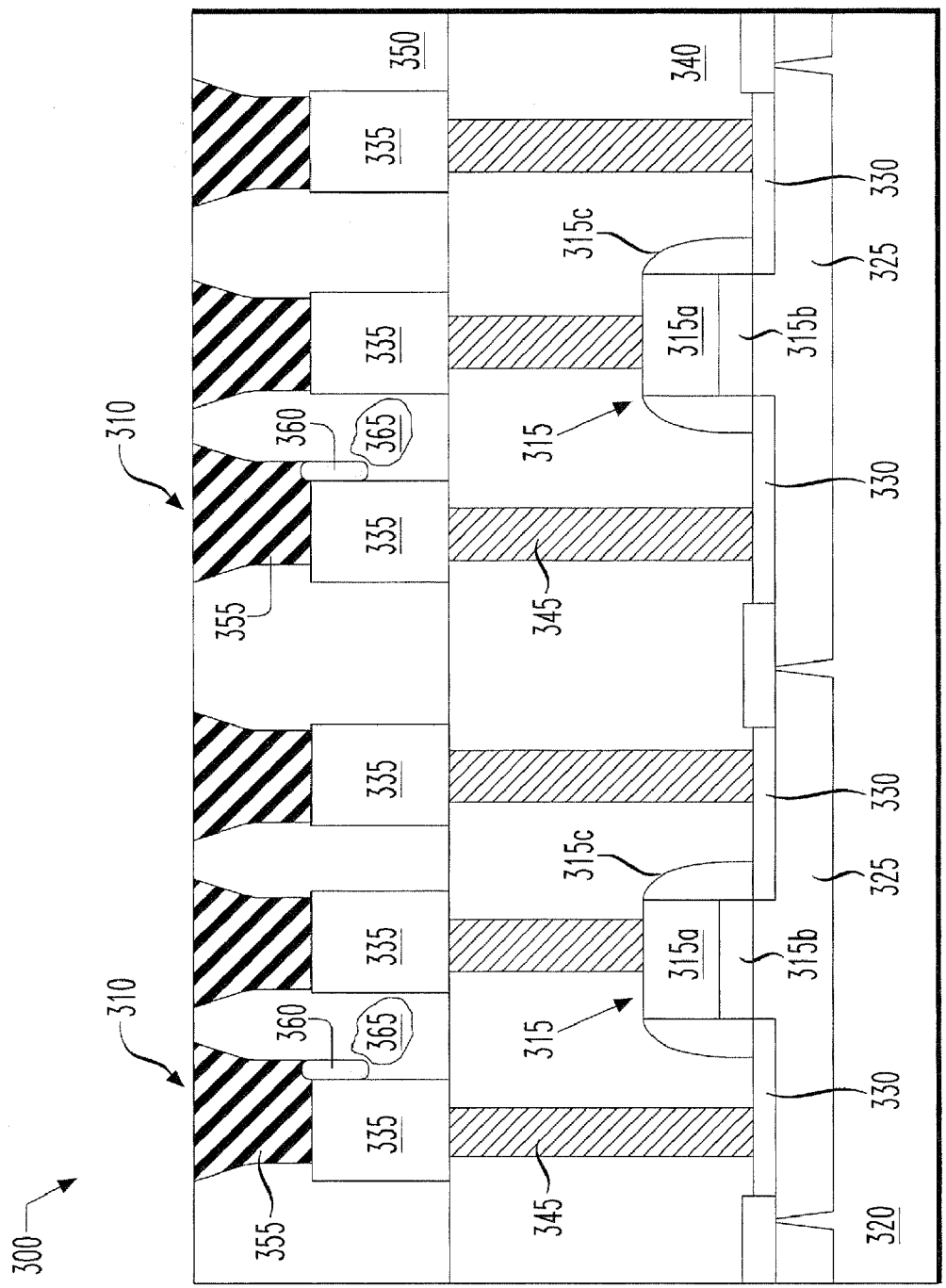
FIG. 3 illustrates a partial sectional view of an integrated circuit incorporating the interconnect of FIG. 1.

FIG. 3, illustrates an integrated circuit 300 having interconnects 310 as provided by the embodiments discussed above. The integrated circuit 300 is only a partial view of the circuit, and those skilled in the art would understand how to incorporated the interconnects 310 provided by the present invention into and complete the integrated circuit 300. In the embodiment illustrated in FIG. 3, the integrated circuit includes conventionally formed transistors 315 that are located over a semiconductor substrate 320 over which are formed conventional wells 325 and source/drains 330. The transistors each include a gate 315a, a gate oxide 315b and oxide spacers 315c. Metal lines 335 are formed over a dielectric layer 340 and are connected to the gates 315a by contact plugs 345 that are formed in the dielectric layer 320. A second dielectric layer 350, in which the interconnects 310 are located, is located over the metal lines 335. Conductive material 355 is excluded from the unlanded portions 360 by the polymer, thereby preventing the conductive material 355 from intersecting the voids 365 and reducing the propensity for short circuits in the integrated circuit 300. As mentioned above, one of ordinary skill in the art would appreciate that addition processing steps can be performed to complete the manufacture of the integrated circuit 300 to make an operative device.

Although the present invention has been described in detail, one of ordinary skill in the art should understand that they can make various changes, substitutions and alterations herein without departing from the scope of the invention.

What is claimed is:

1. A process for forming a semiconductor device interconnect, comprising:
    forming a dielectric layer over a metal line located on a substrate;
    using an etching process to form an opening in said dielectric layer to said metal line, wherein a landed portion of said opening is located over said metal line and an unlanded portion is located along a lateral edge of said metal line;
    adjusting said etching process to promote production of polymer, wherein said polymer at least partially fills said unlanded portion and said landed portion, including sidewalls of said opening; and
    exposing said opening to a clean process to substantially remove said polymer within said landed portion, including sidewalls of said opening, thereby uncovering said sidewalls, but retaining a substantial portion of said polymer in said unlanded portion.

2. The process as recited in claim 1, further including filling said landed portion with a conductive material so as to form an electrical connection with said metal line.

3. The process as recited in claim 1, wherein said dielectric layer includes voids and said unlanded portion is adjacent at least one of said voids.

4. The process as recited in claim 1, wherein adjusting said etching process comprises changing from a first etchant configured to form said opening to a second etchant configured to promote production of said polymer in said unlanded portion.

5. The process as recited in claim 4, wherein said first etchant is a fluorocarbon.

6. The process as recited in claim 4, wherein said second etchant is a hydrofluorocarbon.

7. The process as recited in claim 6, wherein said hydrofluorocarbon is $CHF_3$.

8. The process as recited in claim 4, wherein adjusting said etching process comprises forming said second etchant using an increased a flow rate of an etchant precursor and decreased RF power as compared to said flow rate and said RF power used to form said first etchant.

9. The process as recited in claim 4, wherein said first etchant is $C_4F_8$ and said second etchant is $CH_2F_2$.

10. The process as recited in claim 1, wherein said polymer is a hydrocarbon chain containing fluorine.

11. The process as recited in claim 1, wherein said polymer-filled unlanded portion is substantially coplanar with a top surface of said metal line.

* * * * *